United States Patent
Zhang et al.

(10) Patent No.: US 11,895,831 B2
(45) Date of Patent: Feb. 6, 2024

(54) MANUFACTURING METHOD FOR MEMORY AND MEMORY

(71) Applicant: CHANGXIN MEMORY TECHNOLOGIES, INC., Hefei (CN)

(72) Inventors: Junchao Zhang, Hefei (CN); Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 17/600,828

(22) PCT Filed: Jun. 30, 2021

(86) PCT No.: PCT/CN2021/103863
§ 371 (c)(1),
(2) Date: Oct. 1, 2021

(87) PCT Pub. No.: WO2022/095482
PCT Pub. Date: May 12, 2022

(65) Prior Publication Data
US 2022/0352177 A1 Nov. 3, 2022

(30) Foreign Application Priority Data
Nov. 6, 2020 (CN) .......................... 202011233641.3

(51) Int. Cl.
*H10B 12/00* (2023.01)
*H01L 21/302* (2006.01)
*H01L 29/66* (2006.01)

(52) U.S. Cl.
CPC ......... *H10B 12/488* (2023.02); *H01L 21/302* (2013.01); *H01L 29/66477* (2013.01);
(Continued)

(58) Field of Classification Search
CPC .... H10B 12/488; H10B 12/053; H10B 12/37; H10B 12/482; H10B 12/05; H10B 12/315;
(Continued)

(56) References Cited

U.S. PATENT DOCUMENTS 8,053,316 B2   11/2011 Kim et al.
10,910,379 B2   2/2021 Tang et al.
(Continued)

FOREIGN PATENT DOCUMENTS

CN   110931559 A   3/2020

OTHER PUBLICATIONS

International Search Report in Application No. PCT/CN2021/103863, dated Sep. 26, 2021.

*Primary Examiner* — Yasser A Abdelaziez
(74) *Attorney, Agent, or Firm* — Syncoda LLC; Feng Ma

(57) ABSTRACT

A manufacturing method for memory includes: providing a substrate, and forming a first isolation layer and discrete bit lines on the substrate; removing part of the first isolation layer by a thickness to form discrete first trenches; forming word lines filling the first trenches, wherein the word lines each has a first side wall and a second side wall opposite to each other; forming discrete through holes each being between adjacent word lines; forming a first dielectric layer on surface of exposed first side wall, and forming a second dielectric layer on surface of exposed second side wall; and forming an active layer filling the through holes.

10 Claims, 13 Drawing Sheets

(52) U.S. Cl.
CPC ........... *H10B 12/053* (2023.02); *H10B 12/37* (2023.02); *H10B 12/482* (2023.02)

(58) Field of Classification Search
CPC ....... H10B 12/03; H10B 12/30; H01L 21/302; H01L 29/66477
See application file for complete search history.

(56) References Cited

U.S. PATENT DOCUMENTS

| | | | |
|---|---|---|---|
| 2008/0017911 A1* | 1/2008 | Akahori | H01L 29/42336 438/257 |
| 2011/0143508 A1* | 6/2011 | Kim | H10B 12/34 438/270 |
| 2019/0206872 A1* | 7/2019 | Kim | H10B 12/485 |
| 2020/0111918 A1 | 4/2020 | Karda et al. | |
| 2022/0352173 A1* | 11/2022 | Lee | H10B 12/50 |

\* cited by examiner

MANUFACTURING METHOD FOR MEMORY AND MEMORY

CROSS-REFERENCE TO RELATED APPLICATIONS

This application is a national stage of International Application No. PCT/CN2021/103863 filed on Jun. 30, 2021, which claims priority to Chinese Patent Application No. 202011233641.3 filed on Nov. 6, 2020. The disclosures of these applications are hereby incorporated by reference in their entirety.

TECHNICAL FIELD

The present disclosure relates to, but is not limited to, a manufacturing method for memory and a memory.

BACKGROUND

A memory is a memory component for storing programs and various data information. A random-access memory is divided into a static random-access memory and a dynamic random-access memory. The dynamic random-access memory usually includes a capacitor and a transistor connected to the capacitor. The capacitor is configured to store charges representing storage information. The transistor is a switch that controls inflow and release of the charges from the capacitor. During data writing, a word line provides a high level, the transistor is turned on, and a bit line charges the capacitor. During data reading, the word line also provides a high level, the transistor is turned on, and the capacitor is discharged, so that the bit line obtains a readout signal.

SUMMARY

An overview of the subject matter detailed in the present disclosure is provided below, which is not intended to limit the protection scope of the claims.

The present disclosure provides a manufacturing method for memory and a memory.

A first aspect of the present disclosure provides a manufacturing method for memory, including: providing a substrate, and forming a first isolation layer and discrete bit lines on the substrate, wherein the bit lines extend along a first direction, and the first isolation layer is located on surface of the bit lines away from the substrate and further located between adjacent bit lines; removing part of the first isolation layer by a thickness to form discrete first trenches, wherein the first trenches extend along a second direction, and the second direction is different from the first direction; forming word lines filling the first trenches, wherein the first isolation layer with a certain thickness is provided between the word line and the bit line, and the word lines each has a first side wall and a second side wall opposite to each other; forming discrete through holes each being between adjacent word lines, wherein the through holes expose first side wall and second side wall of the word lines, and surface of the bit lines; and the first side wall and the second side wall are arranged oppositely; forming a first dielectric layer on surface of exposed first side wall, and forming a second dielectric layer on surface of exposed second side wall, wherein a thickness of an equivalent-gate dielectric layer of the first dielectric layer is greater than a thickness of an equivalent-gate dielectric layer of the second dielectric layer; and forming an active layer filling the through holes after the first dielectric layer and the second dielectric layer are formed.

A second aspect of the present disclosure provides a manufacturing method for memory, where the manufacturing method includes: providing a substrate, and forming a first isolation layer and discrete bit lines on the substrate, wherein the bit lines extend along a first direction, and the first isolation layer is located on surface of the bit lines away from the substrate and further located between adjacent bit lines; removing part of the first isolation layer by a thickness to form through holes arranged in an array, wherein the through holes expose part of the surface of the bit lines, and forming an active layer filling the through holes; removing part of the first isolation layer to form discrete first trenches, wherein the first trenches extend along a second direction, and the second direction is different from the first direction; and the first trenches expose first side face and second side face of the active layer, the first side face and the second side face are arranged oppositely; forming a first dielectric layer on the first side face, and forming a second dielectric layer on the second side face, wherein a thickness of an equivalent-gate dielectric layer of the first dielectric layer is greater than a thickness of an equivalent-gate dielectric layer of the second dielectric layer; and forming word lines filling the first trenches after the first dielectric layer and the second dielectric layer are formed.

A third aspect of the present disclosure provides a memory, where the memory includes: a substrate; discrete bit lines located on the substrate, wherein the bit lines extend along a first direction; discrete word lines located on the bit lines, wherein the word lines extend along a second direction, and the second direction is different from the first direction; and the word lines each has a first side wall and a second side wall opposite to each other; an active layer, wherein the active layer is discrete and is provided between the word lines, and the active layer is located on the bit lines; a first isolation layer, wherein the first isolation layer is provided between adjacent bit lines, between the bit line and the word line, and between discrete parts of the active layer; a first dielectric layer, wherein the first dielectric layer is provided between the active layer and the first side wall; and a second dielectric layer, wherein the second dielectric layer is provided between the active layer and the second side wall; wherein a thickness of an equivalent-gate dielectric layer of the first dielectric layer is greater than a thickness of an equivalent-gate dielectric layer of the second dielectric layer.

According to the manufacturing method for memory and the memory provided in the embodiments of the present disclosure, a thickness of an equivalent-gate dielectric layer of first dielectric layer is greater than a thickness of an equivalent-gate dielectric layer of second dielectric layer, that is, a second dielectric layer is used as a gate dielectric layer, and a trench can be formed in an active layer in close contact with the second dielectric layer; and a first dielectric layer is used as an isolation structure, so that interference between adjacent trenches can be avoided. In addition, word lines are formed on bit lines, and an active layer is formed between the word lines, so that the bit lines, the word lines, and the active layer are more closely arranged, and subsequently formed capacitors can also have higher arrangement density, thereby reducing a size of the memory.

Other aspects of the present disclosure are understandable upon reading and understanding of the drawings and detailed description.

BRIEF DESCRIPTION OF THE DRAWINGS

The drawings incorporated into the specification and constituting a part of the specification illustrate the embodiments of the present disclosure, and are used together with the descriptions to explain the principles of the embodiments of the present disclosure. In these drawings, similar reference numerals are used to represent similar elements. The drawings in the following descriptions are some rather than all of the embodiments of the present disclosure. Persons of ordinary skill in the art may obtain other drawings based on these drawings without creative efforts.

DETAILED DESCRIPTION

Figure 1:
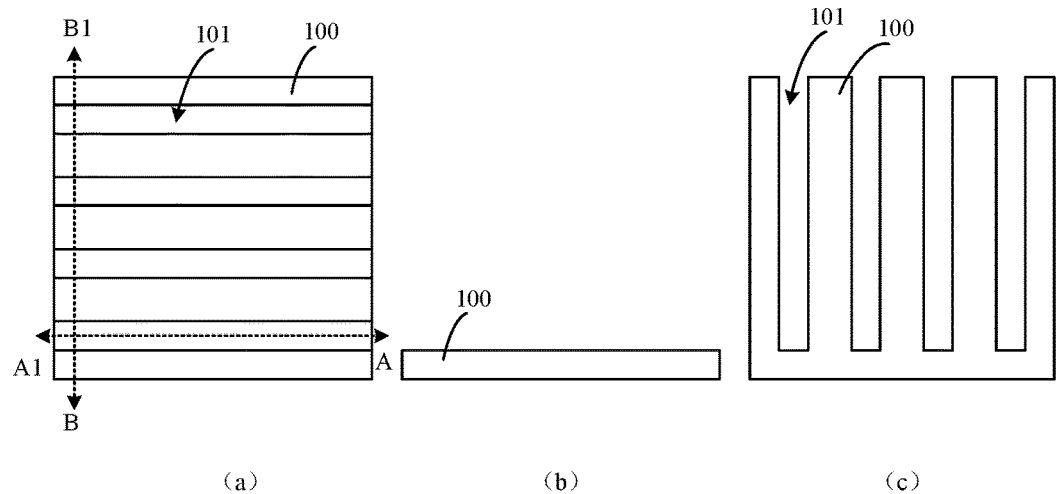
FIG. 1 is a schematic diagram of a structure obtained after second trenches are formed in a substrate in a manufacturing method for memory according to a first embodiment.

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts should fall within the protection scope of the present disclosure. It should be noted that without conflict, the embodiments in the present disclosure and features in the embodiments may be combined with each other.

In an existing manufacturing method for memory, a size of a memory is to be further reduced.

It is found through analysis that main reasons include: a buried word line is usually manufactured in a substrate, a bit line is formed on the word line, and the bit line is connected to an active layer in the substrate through a bit line contact layer. Arrangement density of the word line, the bit line, and the active layer manufactured by the method is not high, leading to low arrangement density of subsequently formed capacitors and a large size of the memory.

The embodiments of the present disclosure provide a manufacturing method for memory and a memory. In the embodiments of the present disclosure, word lines are formed on bit lines, and an active layer is formed between the word lines, so that the bit lines, the word lines, and the active layer are more closely arranged, and subsequently formed capacitors can also have higher arrangement density, thereby reducing a size of the memory.

A first embodiment of the present disclosure provides a manufacturing method for memory. FIG. 1 to FIG. 16 are each a schematic diagram of a structure corresponding to steps in the manufacturing method for memory provided in this embodiment.

Referring to FIG. 1 to FIG. 9, a substrate 100 is provided, and a first isolation layer 107 and discrete bit lines 103 are formed on the substrate 100. The bit lines 103 extend along a first direction. The first isolation layer 107 is located on surface of the bit lines 103 away from the substrate 100 and further located between adjacent bit lines 103.

In this embodiment, a material of the substrate 100 may be a semiconductor such as silicon or germanium. In other embodiments, alternatively, the substrate may be an insulation material such as silicon oxide or silicon nitride.

A material of the bit lines 103 may be a conductive material such as polycrystalline silicon, tungsten, gold, silver, or ruthenium.

The first isolation layer 107 includes a second isolation layer 104 and a third isolation layer 106. In this embodiment, the second isolation layer 104 is located on the bit lines 103, and the third isolation layer 106 is located between adjacent bit lines 103, between parts of the second isolation layer 104, and between parts of the fourth isolation layer 102.

In this embodiment, a material of the second isolation layer 104 is the same as that of the third isolation layer 106, and may be silica, silicon nitride, or silicon carbide. In other embodiments, the material of the second isolation layer may be different from that of the third isolation layer.

The first isolation layer 107 is used to isolate adjacent bit lines 103. In a subsequent process of forming word lines and an active layer, trenches filling the word lines and through holes filling the active layer need to be formed in the first isolation layer 107. Therefore, the first isolation layer 107 is further used to isolate the bit lines 103 and the subsequently formed word lines, and is further used to isolate subsequently formed adjacent discrete parts of the active layer.

Referring to FIG. 1, (a) in FIG. 1 is a top view, (b) in FIG. 1 is a cross-sectional view of (a) in FIG. 1 along a direction A-A1, (c) in FIG. 1 is a cross-sectional view of (a) in FIG. 1 along a direction B-B1, and the step of forming the bit lines 103 and the first isolation layer 107 includes: forming second trenches 101 in the substrate 100.

Figure 2:
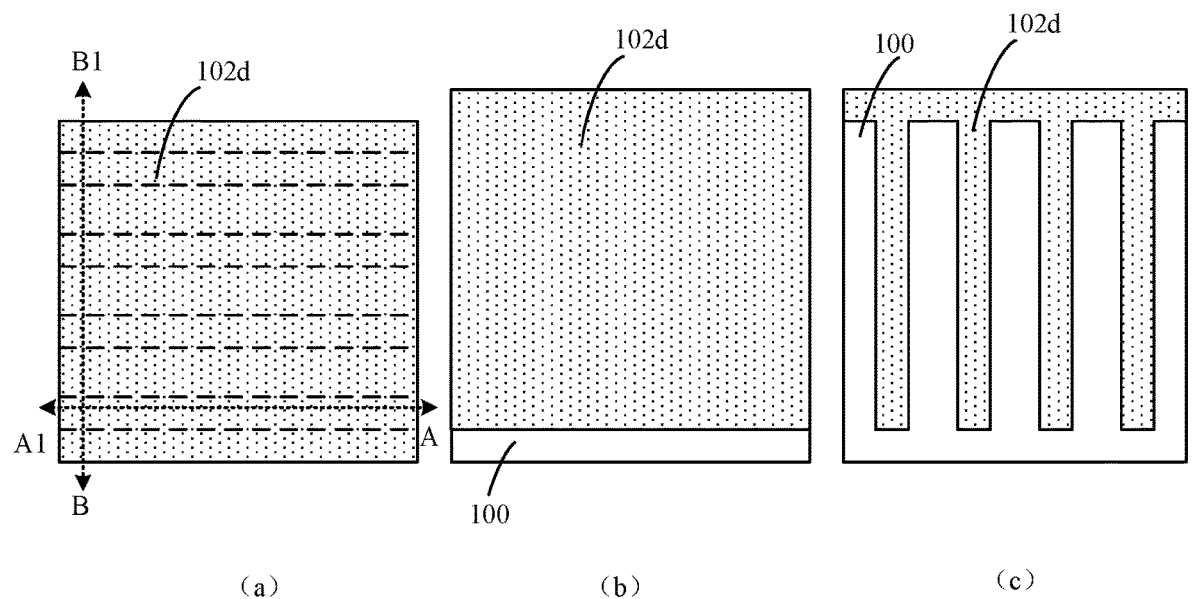
FIG. 2 is a schematic diagram of a structure obtained after an initial fourth isolation layer is formed through deposition in second trenches and the surface of the substrate in the structure shown in FIG. 1.
Figure 3:
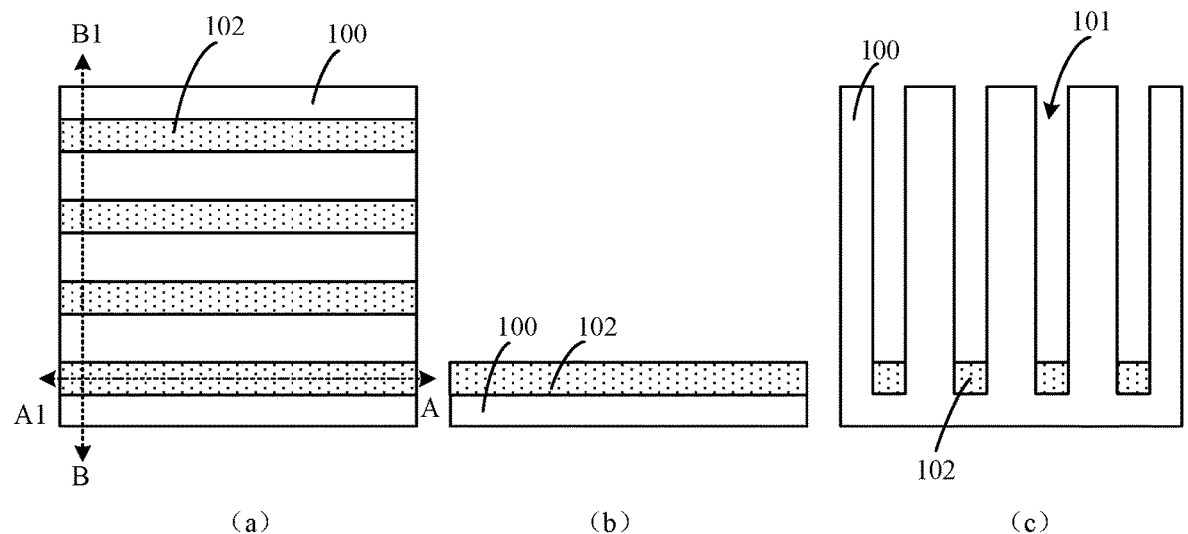
FIG. 3 is a schematic diagram of a structure obtained after a fourth isolation layer is formed by etching back the initial fourth isolation layer in the structure shown in FIG. 2.

Referring to FIG. 2 and FIG. 3, in this embodiment, a fourth isolation layer 102 filling the second trenches 101 is formed. It may be understood that, in other embodiments, if the substrate is of an insulation material, the fourth isolation layer may not be formed.

Referring to FIG. 2, an initial fourth isolation layer 102d is formed in each of the second trenches 101 (referring to FIG. 1) and on surface of the substrate 100 through deposition. The initial fourth isolation layer 102d may be formed by using a chemical vapor deposition process or a physical vapor deposition process.

Referring to FIG. 3, the initial fourth isolation layer 102d (referring to FIG. 2) is etched back, and part of the initial fourth isolation layer 102d higher than the surface of the substrate 100 and in the second trenches 101 are removed, to form the fourth isolation layer 102.

Referring to FIG. 4 to FIG. 7, bit lines 103 and a second isolation layer 104 are sequentially formed in the second trenches 101 (referring to FIG. 3), and the second isolation layer 104 fills the second trenches 101.

Figure 4:
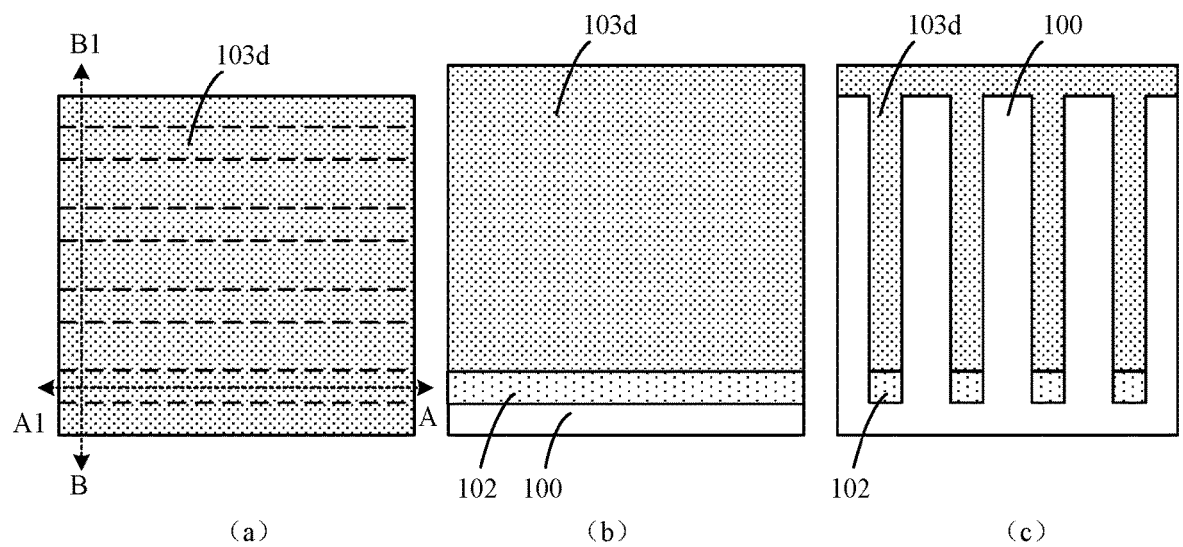
FIG. 4 is a schematic diagram of a structure obtained after an initial bit line layer is formed in the second trenches and the surface of the substrate in the structure shown in FIG. 3.

Referring to FIG. 4, an initial bit line layer 103d is formed on each of the second trenches 101 (referring to FIG. 3) and the surface of the substrate 100.

Figure 5:
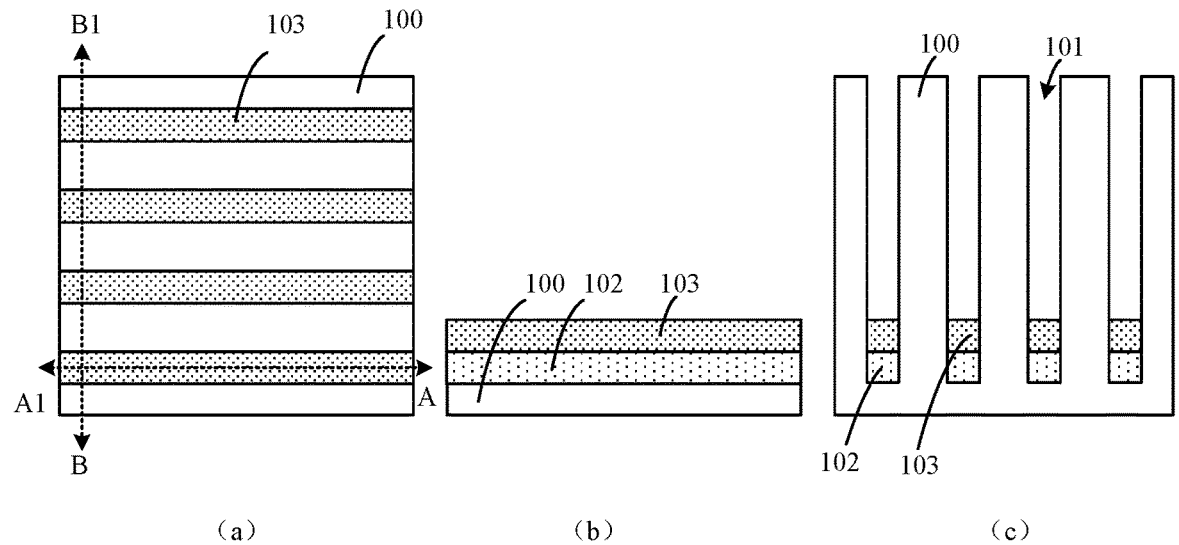
FIG. 5 is a schematic diagram of a structure obtained after bit lines are formed by etching back the initial bit line layer in the structure shown in FIG. 4.

Referring to FIG. 5, the initial bit line layer 103d (referring to FIG. 4) is etched back, part of the initial bit line layer 103d higher than the surface of the substrate 100 and in the second trenches 101 are removed, and the bit lines 103 are formed on the fourth isolation layer 102.

Figure 6:
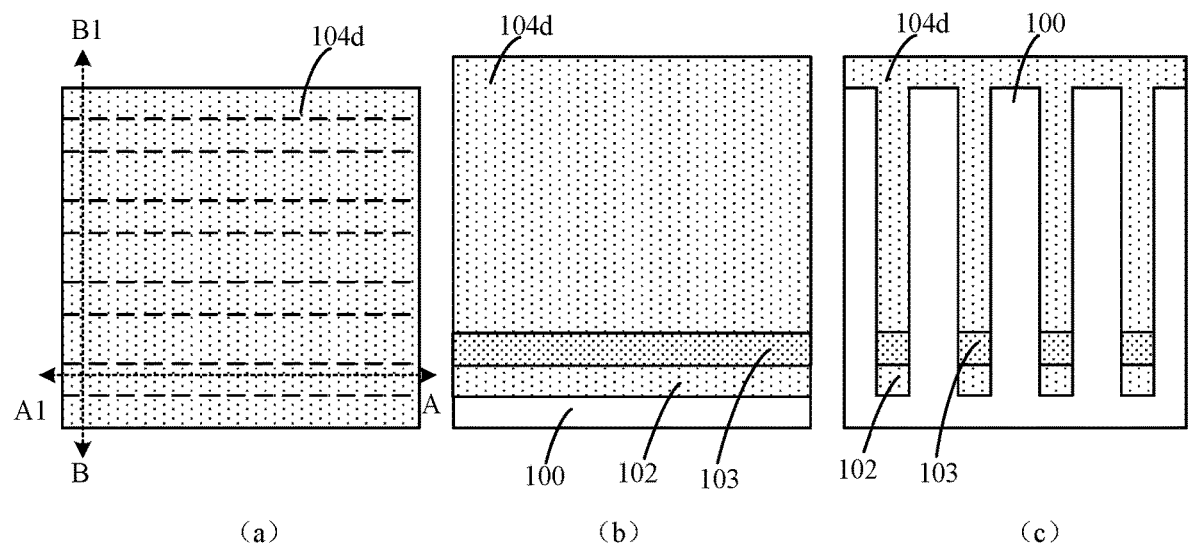
FIG. 6 is a schematic diagram of a structure obtained after an initial second isolation layer is formed in the second trenches and the surface of the substrate in the structure shown in FIG. 5.

Referring to FIG. 6, an initial second isolation layer 104d is formed on each of the second trenches 101 (referring to FIG. 5) and the surface of the substrate 100.

Figure 7:
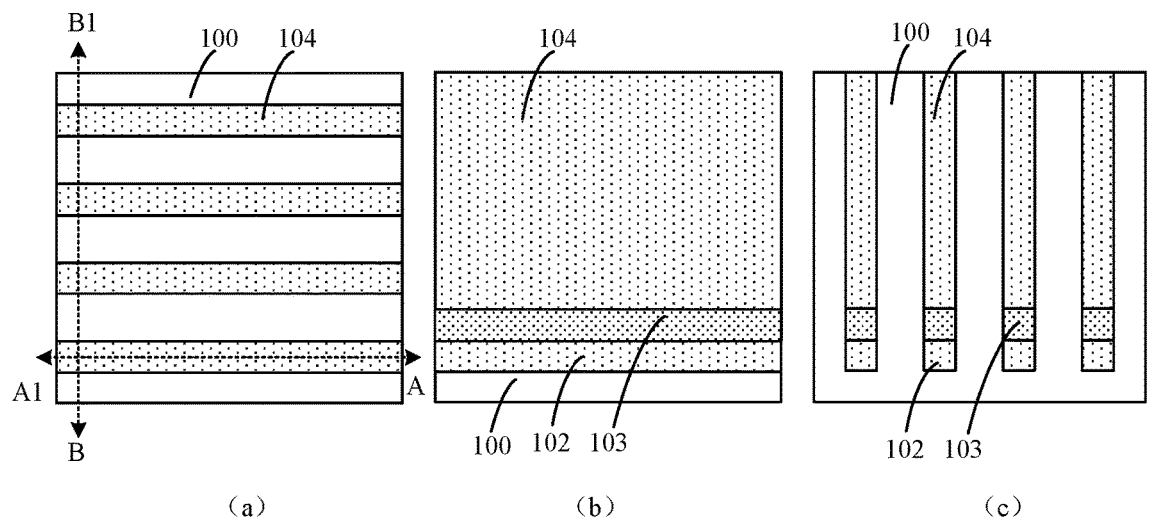
FIG. 7 is a schematic diagram of a structure obtained after a second isolation layer is formed by etching back the initial second isolation layer in the structure shown in FIG. 6.

Referring to FIG. 7, the initial second isolation layer 104d is etched back (referring to FIG. 6), part of the initial second isolation layer 104d higher than the surface of the substrate 100 is removed, to form the second isolation layer 104 located in the second trenches 101 (referring to FIG. 5).

Figure 8:
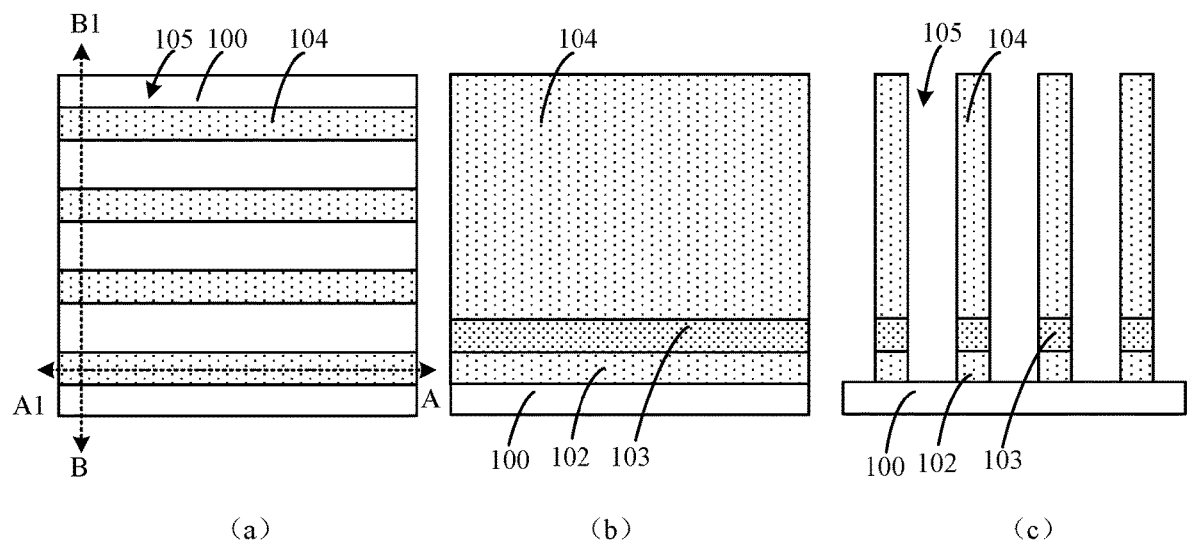
FIG. 8 is a schematic diagram of a structure obtained after third trenches are formed by removing a substrate between bit lines and between parts of the second isolation layer in the structure shown in FIG. 7.

Referring to FIG. 8, the substrate 100 between the bit lines 103 and between parts of the second isolation layer 104 is removed, to form third trenches 105. In this embodiment, the substrate 100 between parts of the fourth isolation layer 102 is further removed.

Figure 9:
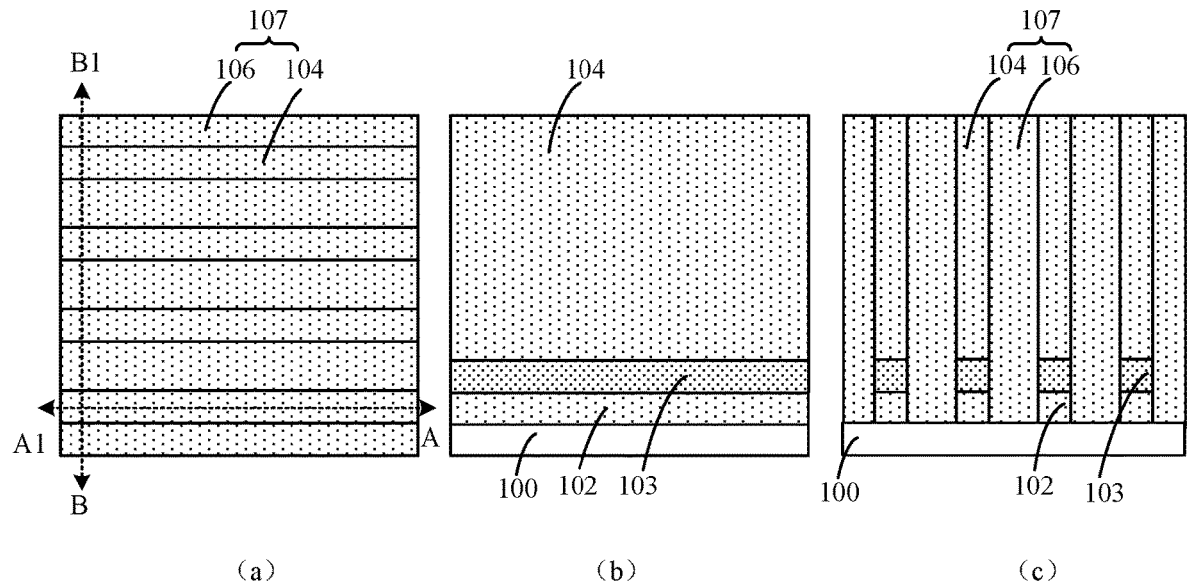
FIG. 9 is a schematic diagram of a structure obtained after a third isolation layer filling the third trenches is formed in the structure shown in FIG. 8.

Referring to FIG. 9, a third isolation layer 106 filling the third trenches 105 is formed, and the third isolation layer 106 and the second isolation layer 104 form the first isolation layer 107.

Figure 10:
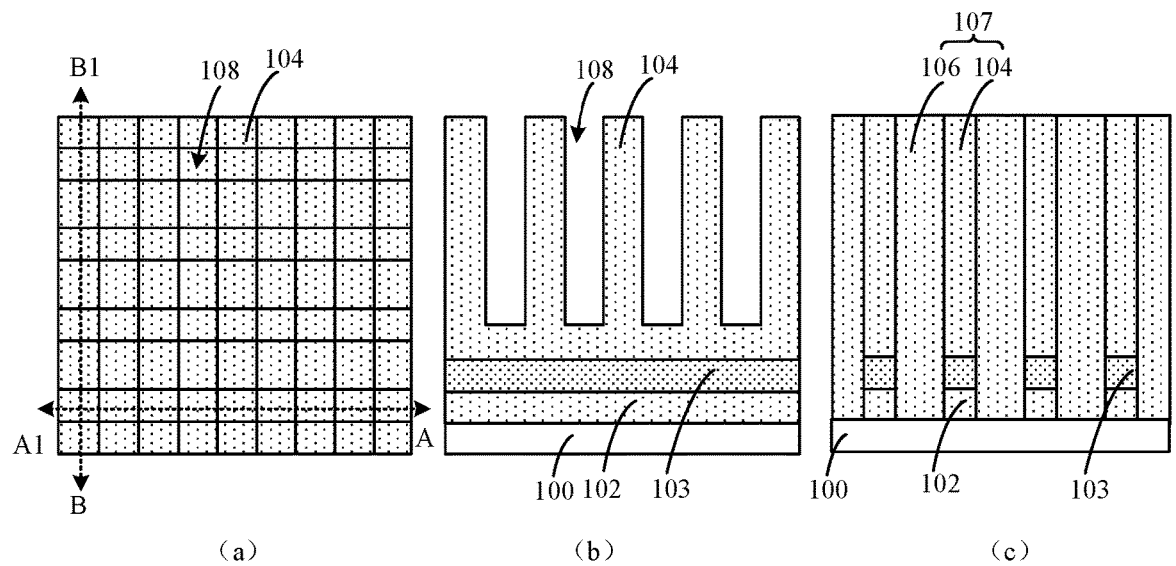
FIG. 10 is a schematic diagram of a structure obtained after part of the first isolation layer is removed by a thickness in the structure shown in FIG. 9.

Referring to FIG. 10, part of the first isolation layer 107 are removed by a thickness, that is, part of the second isolation layer 104 and part of the third isolation layer 106 are removed by a thickness, respectively, to form discrete first trenches 108. The first trenches 108 extend along a second direction. The second direction is different from the first direction.

In this embodiment, the second direction is perpendicular to the first direction.

Figure 11:
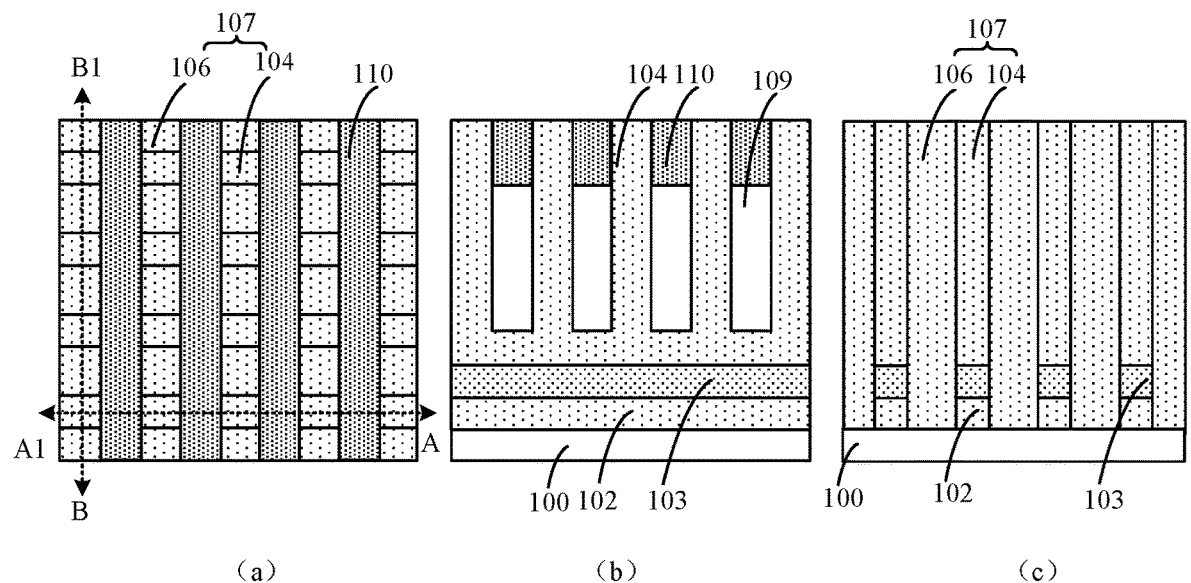
FIG. 11 is a schematic diagram of a structure obtained after word lines filling the first trenches are formed and an insulation cover layer is formed in the word lines in the structure shown in FIG. 10.

Referring to FIG. 11, word lines 109 filling the first trenches 108 (referring to FIG. 10) are formed, and the first isolation layer 107 with a certain thickness is provided between the word line 109 and the bit line 103, that is, the second isolation layer 104 with a certain thickness and the third isolation layer 106 with a certain thickness are provided between the word line 109 and the bit line 103.

The word lines 109 each has a first side wall and a second side wall opposite to each other. The first side wall is located on a same side of all word lines 109, and the second side wall is located on the same side of all the word lines.

After the word lines 109 are formed, an insulation cover layer 110 is formed on the word lines 109.

Referring to FIG. 12 to FIG. 15, discrete through holes 111 are formed between the word lines 109. The through holes 111 expose the first side wall and the second side wall of the word lines 109, and surface of the bit lines 103; the first side wall and the second side wall are arranged oppositely. A first dielectric layer 112 is formed on the surface of the exposed first side wall. A second dielectric layer 113 is formed on the surface of the exposed second side wall. A thickness of an equivalent-gate dielectric layer of the first dielectric layer 112 is greater than a thickness of an equivalent-gate dielectric layer of the second dielectric layer 113.

When the word lines 109 are activated, a second dielectric layer 113 is equivalent to a tablet capacitor. At a voltage, an electric field is generated between the word lines 109 and a subsequently formed active layer, so that minority carriers in the active layer are attracted to the surface close to the word lines 109. When the voltage reaches a particular value, these minority carriers form a strong inversion layer on the surface of the active layer close to the word lines 109. When the bit lines 103 are turned on, the strong inversion layer is turned on to form trenches to control charges in the capacitor. The second dielectric layer 113 is used as a gate dielectric layer, with a relatively small thickness. A main reason is that a relatively thin gate dielectric layer can provide a large gate capacitor, with a relatively small threshold voltage and a favorable gate control capability.

Insulation performance of the dielectric layer is related to a thickness and a dielectric constant thereof. A larger thickness indicates a higher dielectric constant and better insulation performance. The first dielectric layer 112 has an isolation function, to prevent the word lines 109 from affecting trenches close to the second side wall thereof, that is, to prevent the word lines from affecting trenches on its right side. Therefore, the first dielectric layer 112 has a relatively large thickness and a relatively high dielectric constant.

The thickness of the equivalent-gate dielectric layer is a thickness of a silicon-oxide dielectric layer when a high-dielectric-constant dielectric layer and a silicon-oxide dielectric layer reach a same capacitance. In an example, materials of both the first dielectric layer 112 and the second dielectric layer 113 are silicon oxide, and the thickness of the first dielectric layer 112 should be greater than the thickness of the second dielectric layer 113. In another example, materials of both the first dielectric layer 112 and the second dielectric layer 113 are high-dielectric constant materials, and the thickness of the equivalent-gate dielectric layer of the first dielectric layer 112 should be greater than the thickness of the equivalent-gate dielectric layer of the second dielectric layer 113. In this way, trenches can be formed on the surface of the active layer close to the second dielectric layer 113, and the first dielectric layer 112 can prevent the word lines 109 from interfering with trenches close to the second side wall, that is, trenches can be formed only on the left side of the word lines, and trenches cannot be formed on the right side.

In this embodiment, the first dielectric layer 112 is of a two-layer structure, including an initial first dielectric layer 112$d$ and an initial second dielectric layer 113$d$. A material of the initial first dielectric layer 112$d$ is a high-dielectric constant material, and may be $Al_2O_3$ or ZrO. The high-dielectric constant material has excellent insulation properties, and can avoid electric leakage or reduce interference. A material of the initial second dielectric layer 113$d$ is silicon oxide. In other embodiments, alternatively, the initial first dielectric layer may be silicon oxide, and correspondingly, a thickness of the initial first dielectric layer may be increased; or the material of the initial second dielectric layer may be a high-dielectric constant material.

The thickness of the initial first dielectric layer 112$d$ is 3 nm to 7 nm, for example, 3 nm, 5 nm, or 6 nm. A thickness of the initial second dielectric layer 113$d$ is 4 nm to 8 nm, for example, 3 nm, 5 nm, or 7 nm.

The material of the second dielectric layer 113 is silicon oxide. In other embodiments, alternatively, the material of the second dielectric layer may be a high-dielectric constant material. The thickness of the second dielectric layer 113 is 4 nm to 8 nm, for example, 3 nm, 5 nm, or 7 nm.

In this embodiment, the first dielectric layer 112 and the second dielectric layer 113 are formed after the formation of the through holes 111. This can ensure that the first dielectric layer 112 and the second dielectric layer 113 are not damaged during etching of the through holes 111.

It may be understood that, in other implementations, the first dielectric layer and the second dielectric layer may be formed first, then the word lines are formed between the first dielectric layer and the second dielectric layer, and the through holes are formed after the formation of the word lines.

Figure 12:
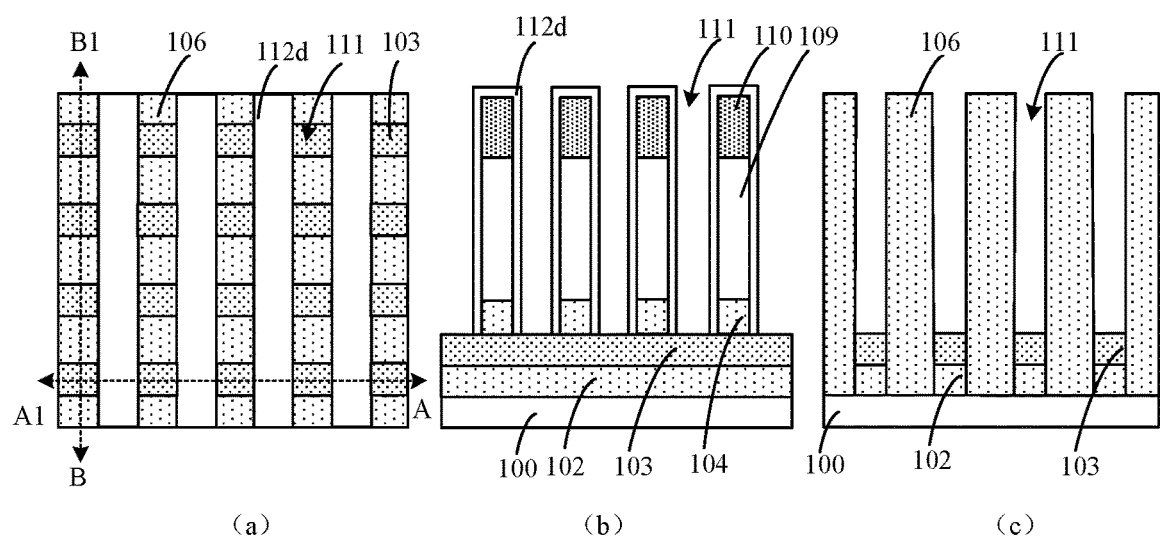
FIG. 12 is a schematic diagram of a structure obtained after an initial first dielectric layer is formed on the surface of exposed first side wall and the surface of exposed second side wall after discrete through holes are formed between word lines in the structure shown in FIG. 11.

It should be noted that, because the thickness of the first dielectric layer 112 and the thickness of the second dielectric layer 113 are each much smaller than a width of the word lines, in each of FIG. 12 to FIG. 16, the top view (a) does not show the first dielectric layer 112 and the second dielectric layer 113. Process steps of forming the first dielectric layer 112 and the second dielectric layer 113 include:

Referring to FIG. 12, the initial first dielectric layer 112$d$ is formed on surface of the exposed first side wall and surface of the exposed second side wall.

In this embodiment, the initial first dielectric layer 112$d$ is further located on the top and a side wall of the insulation cover layer 110.

Figure 13:
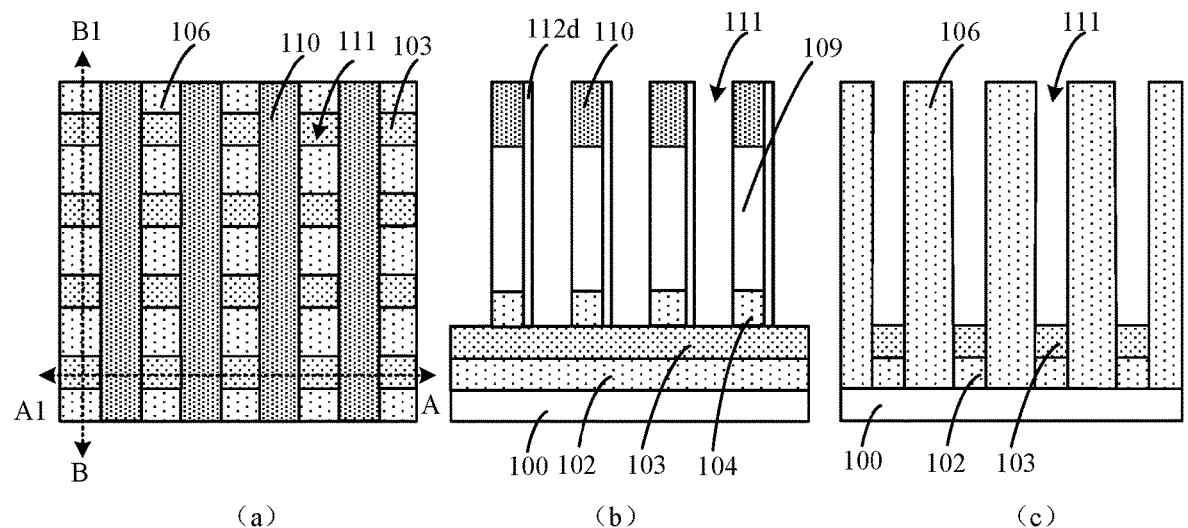
FIG. 13 is a schematic diagram of a structure obtained after the initial first dielectric layer on the second side wall is removed in the structure shown in FIG. 12.

Referring to FIG. 13, the initial first dielectric layer 112$d$ on the second side wall is removed.

In this embodiment, the initial first dielectric layer 112$d$ on the top of the insulation cover layer 110 is further removed.

It may be understood that, in other embodiments, the initial first dielectric layer on the side wall of the insulation cover layer may further be removed; or in other embodiments, the initial first dielectric layer on the side wall and the top of the insulation cover layer may be retained.

Figure 14:
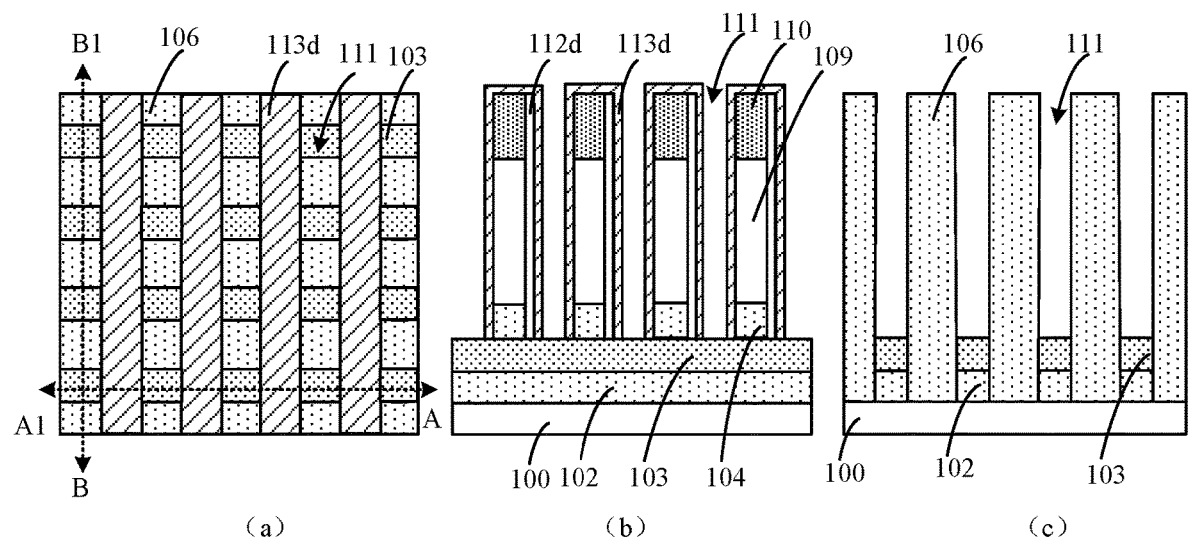
FIG. 14 is a schematic diagram of a structure obtained after an initial second dielectric layer is formed on the surface of remaining initial first dielectric layer and the surface of the exposed second side wall in the structure shown in FIG. 13.

Referring to FIG. 14, the initial second dielectric layer 113$d$ is formed on surface of the remaining initial first dielectric layer 112$d$ and the surface of the exposed second side wall. In this embodiment, the initial second dielectric layer 113$d$ is further formed on the side wall and the top of the insulation cover layer 110.

Figure 15:
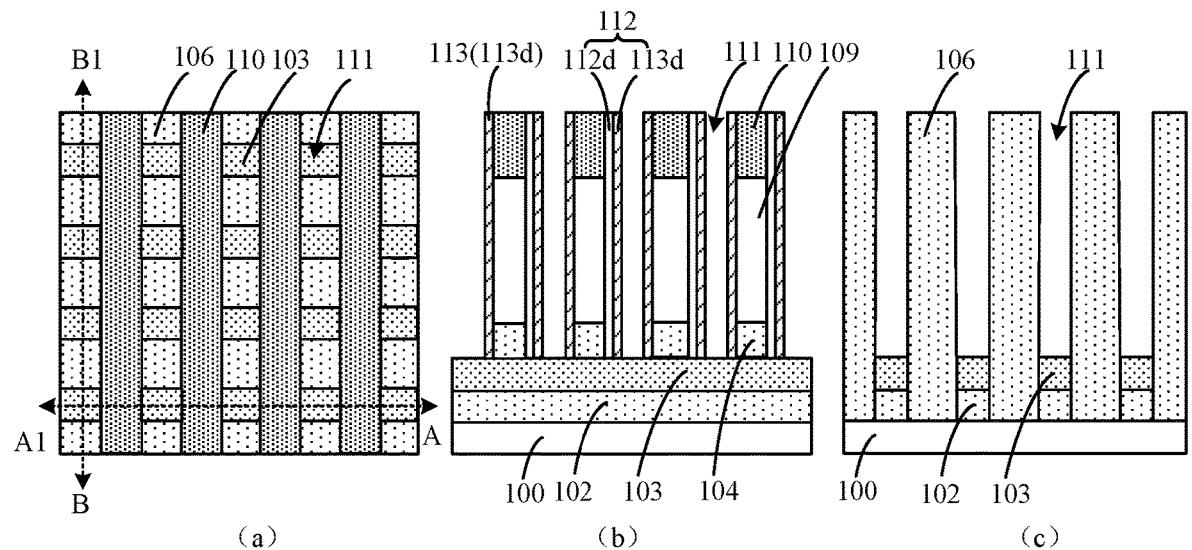
FIG. 15 is a schematic diagram of a structure obtained after the initial second dielectric layer on the top of an insulation cover layer in the structure shown in FIG. 14.

Referring to FIG. 15, the initial second dielectric layer 113$d$ on the top of the insulation cover layer 110 is removed.

It may be understood that, in other embodiments, alternatively, the initial second dielectric layer on the top of the insulation cover layer may not be removed; or the initial second dielectric layer on the side wall of the insulation cover layer is also removed.

The remaining initial first dielectric layer 112$d$ and the initial second dielectric layer 113$d$ covering the initial first dielectric layer 112$d$ are used as the first dielectric layer 112. The initial second dielectric layer 113$d$ covering the surface of the second side wall is used as the second dielectric layer 113.

Figure 16:
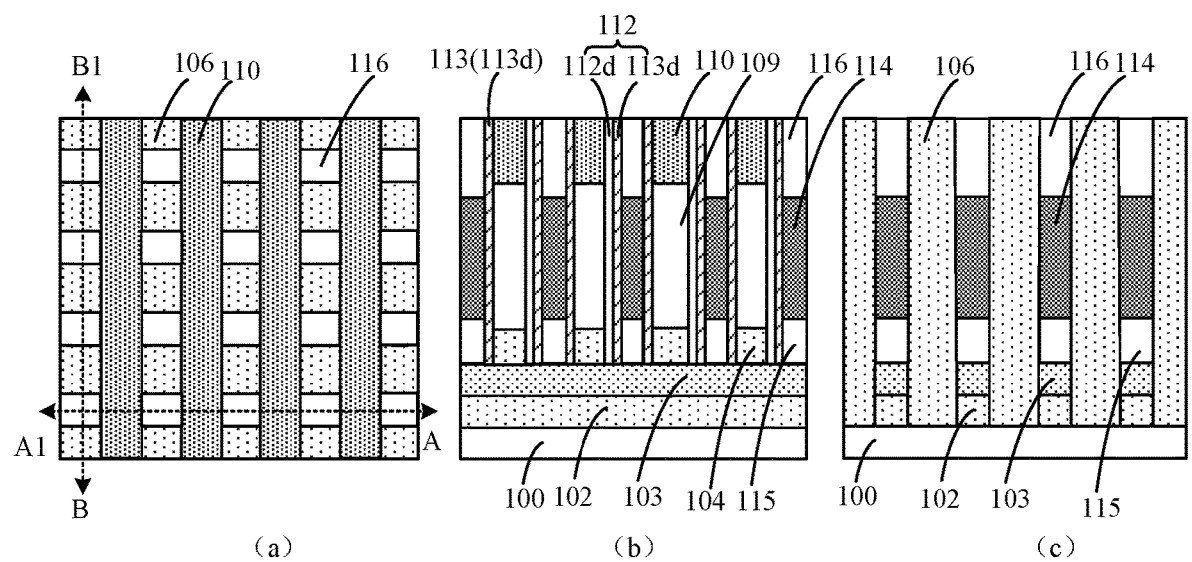
FIG. 16 is a schematic structural diagram of a memory formed after an active layer filling the through holes is formed in the structure shown in FIG. 15.

Referring to FIG. 16, an active layer 114 filling the through holes 111 is formed. For example, polycrystalline silicon is deposited in the through holes 111 first, and then ion implantation is performed on the polycrystalline silicon to form the active layer 114.

The word lines 109 and the discrete active layer 114 are arranged at intervals, the arrangement is dense, and space utilization is high. In this embodiment, before the forming the active layer 114, the method further includes: forming a bit line contact layer 115, where the bit line contact layer 115 is located between the bit line 103 and the active layer 114.

After the forming the active layer 114, the method may further include: forming a capacitive contact layer 116 on the active layer 114, where the capacitive contact layer 116 is further located between the insulation cover layer 110.

In summary, in this embodiment, the word lines 109 are formed on the bit lines 103, and the active layer 114 is formed between the word lines 109, so that the bit lines 103, the word lines 109, and the active layer 114 are more closely arranged, and subsequently formed capacitors can also have higher arrangement density, thereby increasing a storage capacity and reducing the size of the memory. In addition, the first dielectric layer 112 and the second dielectric layer 113 are formed only after the formation of the through holes 111. This can avoid damage caused to the first dielectric layer 112 and the second dielectric layer 113 during etching of the through holes 111.

A second embodiment of the present disclosure provides a manufacturing method for memory. The manufacturing method for memory in the second embodiment is substantially the same as that in the first embodiment, and a main difference lies in steps of forming the active layer, the first dielectric layer, and the word lines. FIG. 17 to FIG. 22 are each a schematic diagram of a structure corresponding to steps in the manufacturing method for memory provided in this embodiment.

Figure 17:
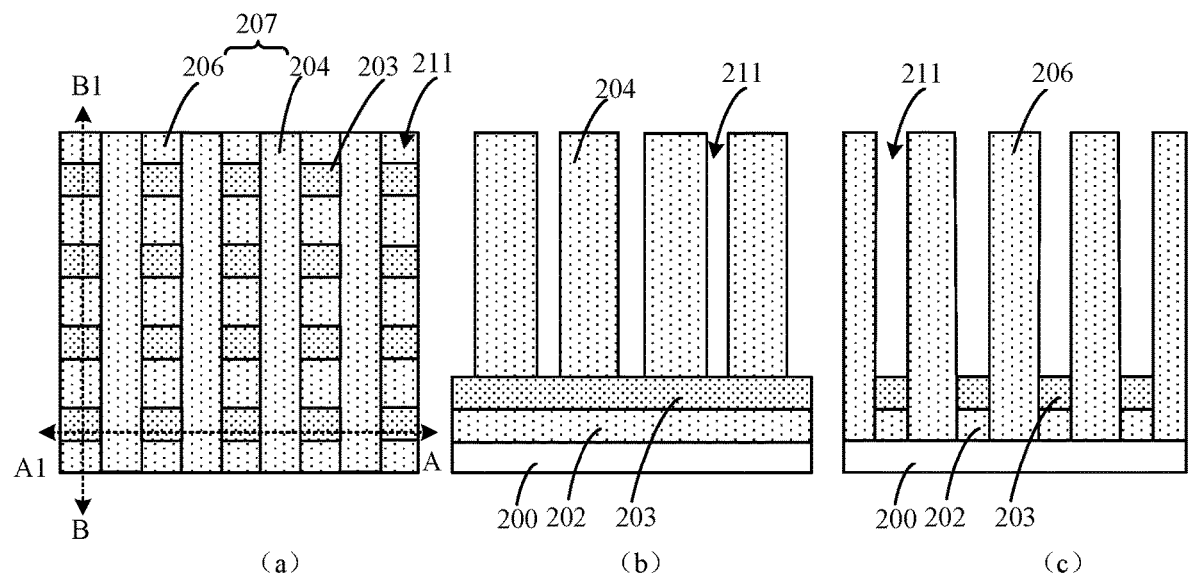
FIG. 17 is a schematic diagram of a structure obtained after through holes are formed by removing part of a first isolation layer by a thickness in a step of forming an active layer in a manufacturing method for memory according to a second embodiment.

Referring to FIG. 17, in this embodiment, the steps of forming a first isolation layer 207 and bit lines 203 include: providing a substrate 200, and forming a first isolation layer 207 and discrete bit lines 203 on the substrate 200, where the bit lines 203 extend along a first direction, and the first isolation layer 207 is located on surface of the bit lines 203 away from the substrate 200 and further located between adjacent bit lines 203.

For specific steps, refer to the first embodiment. Details are not described herein again.

Referring to FIG. 17, a step of forming an active layer 214 includes: removing part of the first isolation layer 207 by a thickness, that is, removing part of the second isolation layer 204 and part of the third isolation layer 206 by a thickness, respectively, and forming through holes 211 arranged in an array, where the through holes 211 expose part of surface of the bit lines 203.

Figure 18:
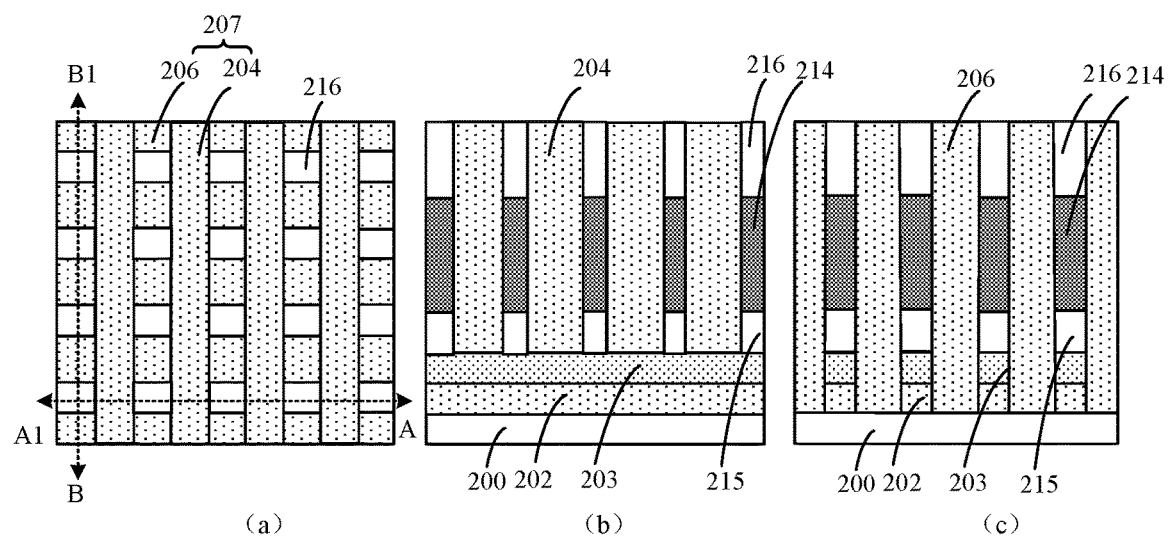
FIG. 18 is a schematic diagram of a structure obtained after the active layer filling through holes is formed in the structure shown in FIG. 17.

Referring to FIG. 18, the active layer 214 filling the through holes 211 is formed.

Before the active layer 214 is formed, a bit line contact layer 215 is formed in the through holes 211, and the bit line contact layer 215 is electrically connected to the bit lines 203. After the active layer 214 is formed, a capacitive contact layer 216 is formed on the active layer 214.

Figure 19:
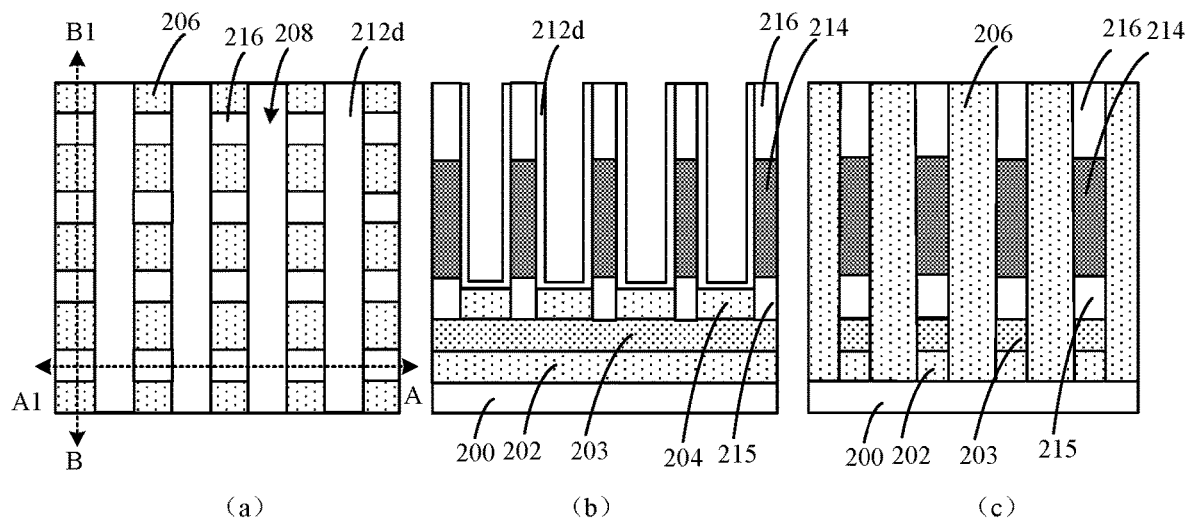
FIG. 19 is a schematic diagram of a structure obtained after an initial first dielectric layer is formed on the first side face and the second side face after discrete first trenches are formed in the structure shown in FIG. 18.
Figure 20:
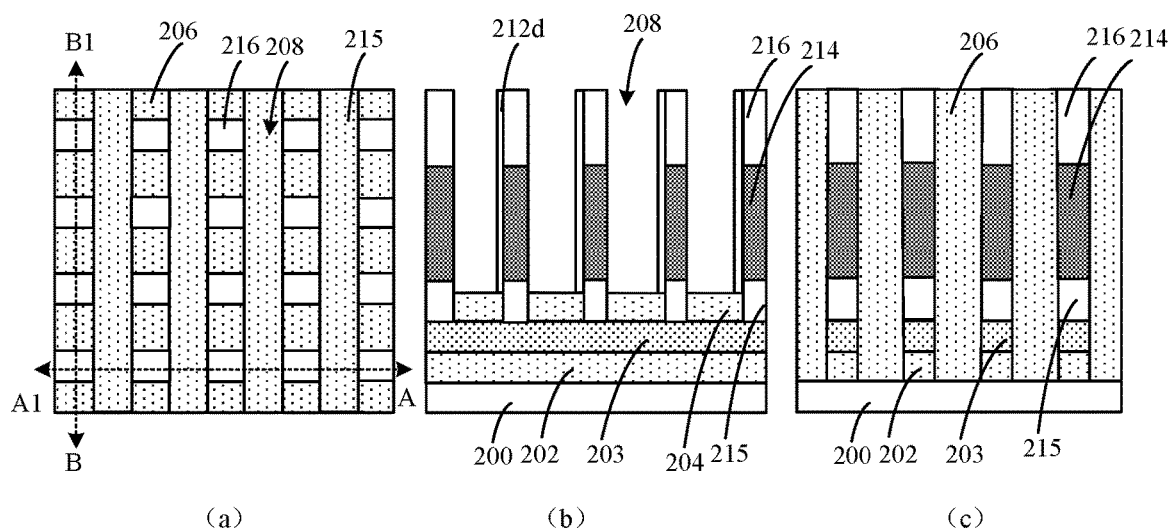
FIG. 20 is a schematic diagram of a structure obtained after the initial first dielectric layer on the second side face is removed in the structure shown in FIG. 19.
Figure 21:
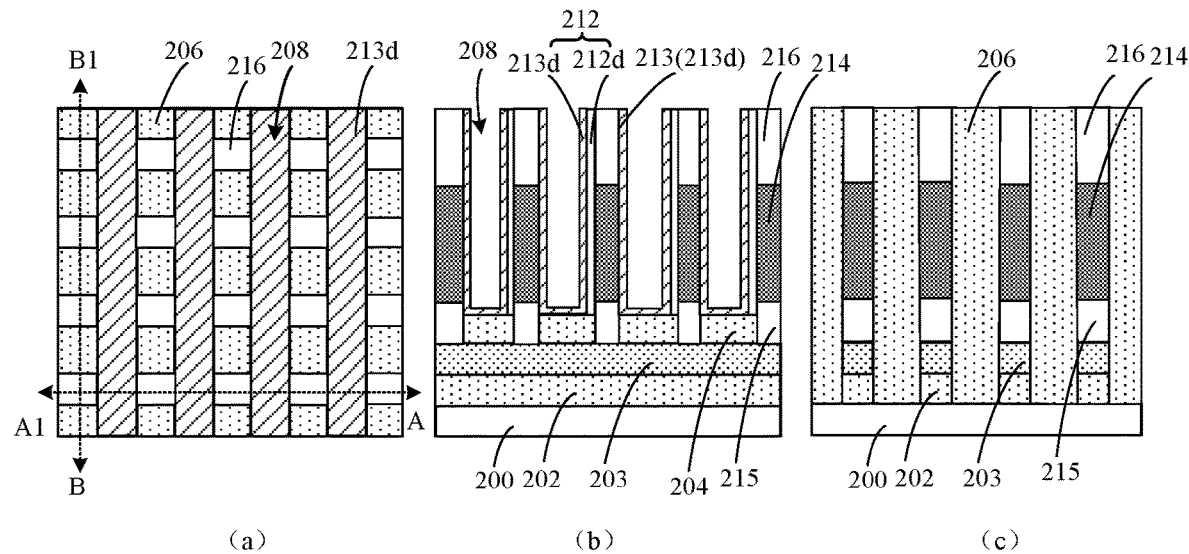
FIG. 21 is a schematic diagram of a structure obtained after an initial second dielectric layer is formed on the surface of remaining initial first dielectric layer and the second side face in the structure shown in FIG. 20.

Referring to FIG. 19 to FIG. 21, the steps of forming a first dielectric layer 212 and a second dielectric layer 213 include: removing part of the first isolation layer 207, that is, removing part of the second isolation layer 204 and part of the third isolation layer 206 by a thickness, respectively, to form discrete first trenches 208, where the first trenches 208 extend along a second direction, and the second direction is different from the first direction, where the first trenches 208 expose first side face and second side face of the active layer 214, the first side face and the second side face of an active layer are arranged oppositely; forming the first dielectric layer 212 on the first side face, and forming the second dielectric layer 213 on the second side face, where a thickness of an equivalent-gate dielectric layer of the first dielectric layer 212 is greater than a thickness of an equivalent-gate dielectric layer of the second dielectric layer 213.

Referring to FIG. 19, an initial first dielectric layer 212d is formed on each of the first side face and the second side face. In this embodiment, the initial first dielectric layer 212d are further located on the second isolation layer 204.

Referring to FIG. 20, the initial first dielectric layer 212d on the second side face is removed. In this embodiment, the initial first dielectric layer 212d on the second isolation layer 204 is further removed. It may be understood that, because a material of the initial first dielectric layer 212d is also an insulation material, the initial first dielectric layer 212d on the second isolation layer 204 may not be removed.

An initial second dielectric layer 213d is formed on surface of the remaining initial first dielectric layer 212d and the second side face. The remaining initial first dielectric layer 212d and the initial second dielectric layer 213d covering the initial first dielectric layer 212d are used as the first dielectric layer 212. The initial second dielectric layer 213d covering the second side face is used as the second dielectric layer 213. In this embodiment, the initial second dielectric layer 213d located on the second isolation layer 204 is further removed. It may be understood that, because a material of the initial second dielectric layer 213d is also an insulation material, the initial second dielectric layer 213d on the second isolation layer 204 may not be removed.

Figure 22:
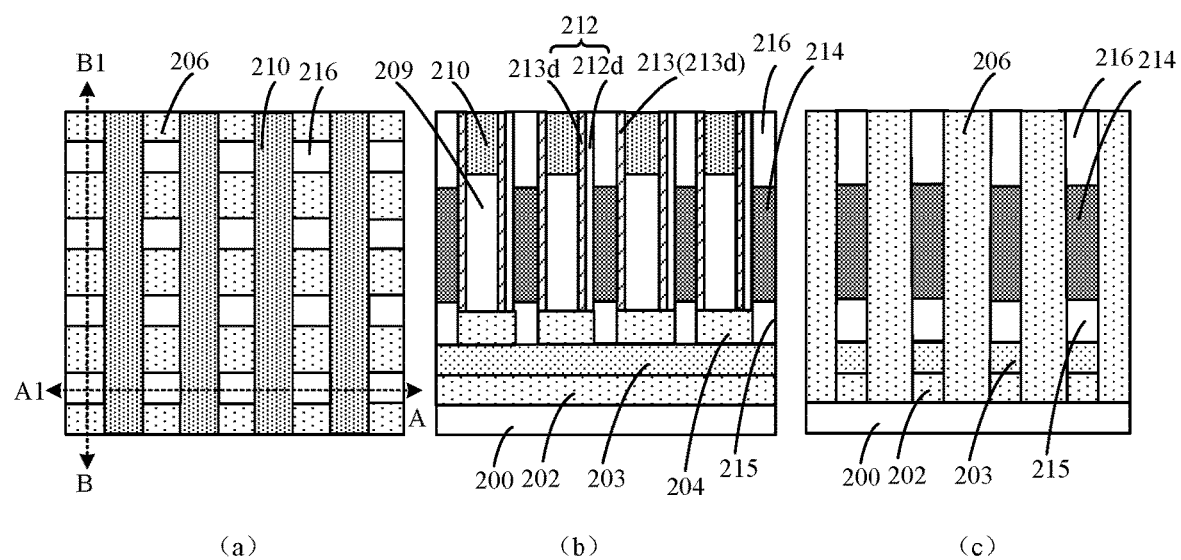
FIG. 22 is a schematic diagram of a structure obtained after word lines filling the first trenches are formed after first dielectric layer and second dielectric layer are formed in the structure shown in FIG. 21.

Referring to FIG. 22, after the first dielectric layer 212 and the second dielectric layer 213 are formed, word lines 209 filling the first trenches 208 (referring to FIG. 21) are formed.

The insulation cover layer 210 is formed on the word lines 209.

In summary, compared with the first embodiment, this embodiment adjusts the steps of forming the active layer 214, the word lines 209, the first dielectric layer 212, and the second dielectric layer 213, that is, the active layer 214 is formed first, and then the first dielectric layer 212, the second dielectric layer 213, and the word lines 209 are formed, thereby avoiding damage to the first dielectric layer 212 and the second dielectric layer 213 by an etching process. In addition, because the word lines 209, the bit lines 203, and the active layer 214 are densely arranged, arrangement density of subsequently formed capacitors can be increased, space utilization can be improved, and the size of the memory can be reduced.

Figure 23:
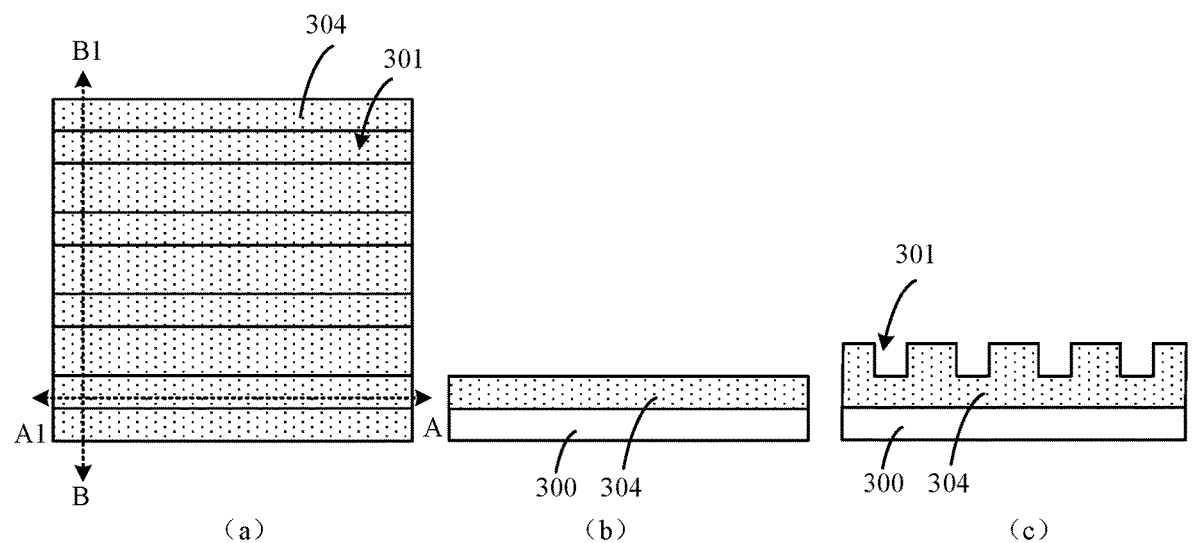
FIG. 23 is a schematic diagram of a structure obtained after second trenches are formed in a substrate in a manufacturing method for memory according to a third embodiment.
Figure 24:
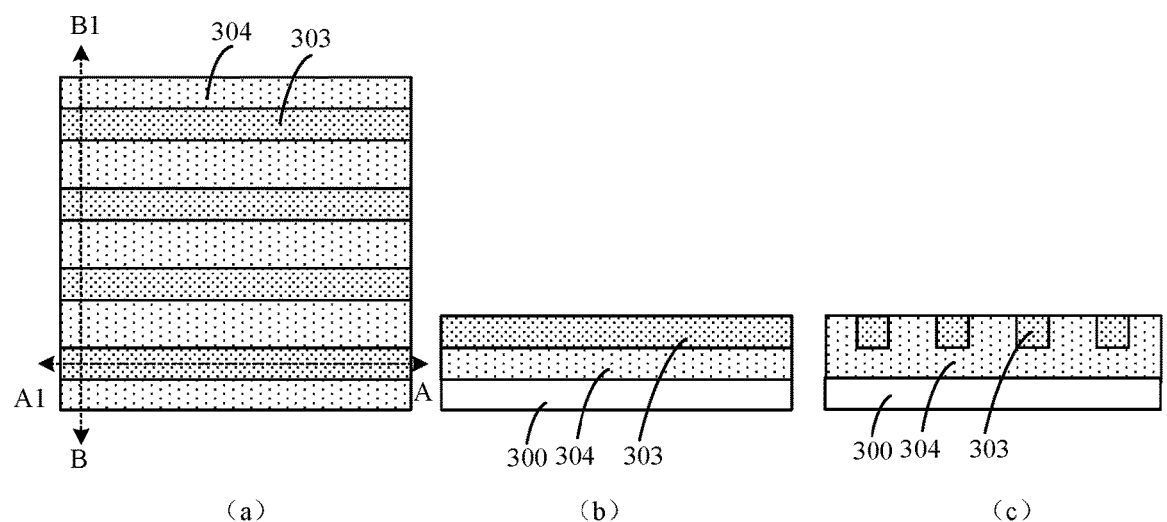
FIG. 24 is a schematic diagram of a structure obtained after bit lines filling the second trenches are formed in the structure shown in FIG. 22.
Figure 25:
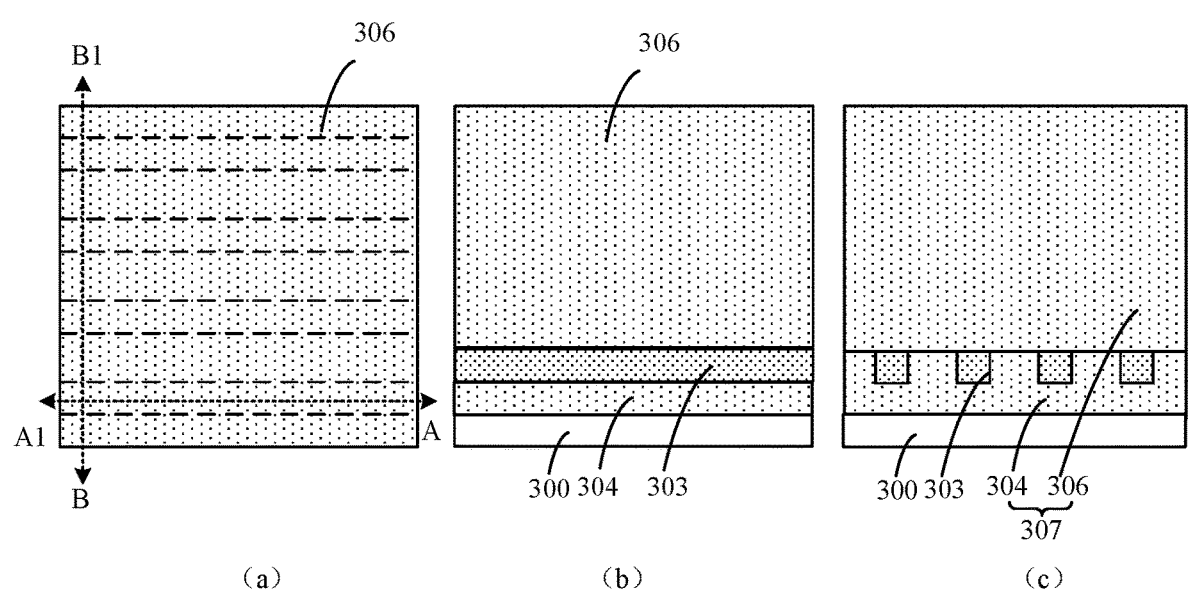
FIG. 25 is a schematic diagram of a structure obtained after a third isolation layer is formed on the bit lines and the second isolation layer in the structure shown in FIG. 24.

A third embodiment of the present disclosure provides a manufacturing method for memory. This embodiment is substantially the same as the first embodiment and the second embodiment, and a main difference lies in steps of forming a first isolation layer 307 and bit lines 303. FIG. 23 to FIG. 25 are each a schematic diagram of a structure corresponding to steps in the manufacturing method for memory in this embodiment.

Referring to FIG. 23, a substrate 300 is provided, the second isolation layer 304 is formed on the substrate 300, and second trenches 301 are formed on the second isolation layer 304. The second trenches 301 may expose surface of the substrate 300, or may not expose the surface of the substrate 300.

Referring to FIG. 24, bit lines 303 filling the second trenches 301 are formed.

Referring to FIG. 25, a third isolation layer 306 is formed on the bit lines 303 and the second isolation layer 304; and the second isolation layer 304 and the third isolation layer 306 form a first isolation layer 307.

After the first isolation layer 307 and the bit lines 303 are formed, an active layer, word lines, a first dielectric layer, and a second dielectric layer are further formed. For specific steps, refer to the first embodiment and the second embodiment. It may be understood, either the manufacturing method provided in the first embodiment or the manufacturing method provided in the second embodiment may be used to form the active layer, the word lines, the first dielectric layer, and the second dielectric layer. This is not limited in this embodiment.

In summary, in this embodiment, the second isolation layer 304 is formed on the substrate 300, the second trenches 301 filling the bit lines 303 are formed in the second isolation layer 304, and the third isolation layer 306 is formed on the bit lines 303 and the surface of the second isolation layer 304, thereby simplifying the process of forming the bit lines 303 and the first isolation layer 307, and reducing manufacturing costs.

A fourth embodiment of the present disclosure provides a memory. FIG. 16 is a schematic structural diagram of the memory according to this embodiment.

Referring to FIG. 16, the memory includes: a substrate 100, discrete bit lines 103 located on the substrate 100, where the bit lines 103 extend along a first direction; and discrete word lines 109 located on the bit lines 103, where the word lines 109 extend along a second direction, the second direction is different from the first direction, and first side wall and second side wall are provided between the word lines 109, first side wall and second side wall are arranged oppositely; where an active layer 114 is provided between the word lines 109, and the active layer 114 is discrete and is located on the bit lines 103; a first isolation layer 107 is provided between adjacent bit lines 103, between the bit lines 103 and the word lines 109, and between adjacent discrete parts of the active layer 114; a first dielectric layer 112 is provided between the active layer 114 and the first side wall; a second dielectric layer 113 is provided between the active layer 114 and the second side wall; and a thickness of an equivalent-gate dielectric layer of the first dielectric layer 112 is greater than a thickness of an equivalent-gate dielectric layer of the second dielectric layer 113.

Details are described below with reference to the accompanying drawings.

A material of the substrate 100 may be a semiconductor such as silicon or germanium, or may be an insulation material such as silicon oxide, silicon nitride, or silicon carbide.

The bit lines 103 are provided on the substrate 100, the word lines 109 are provided on the bit lines 103, and the active layer 114 is provided between adjacent word lines 109. Such arrangement has high density and can reduce the size of the memory.

The first dielectric layer 112 is of a two-layer structure, including an initial first dielectric layer 112$d$ and an initial second dielectric layer 113$d$. The initial first dielectric layer 112$d$ covers the first side wall, and the initial second dielectric layer 113$d$ covers the initial first dielectric layer.

In this embodiment, a material of the initial first dielectric layer 112$d$ is a high-dielectric constant material, and a material of the initial second dielectric layer 113$d$ is silicon oxide. The high-dielectric constant material has excellent insulation properties, and can effectively avoid impact between adjacent trenches. It may be understood that, in other embodiments, alternatively, the material of the initial second dielectric layer may be a high-dielectric constant material; or the material of the initial first dielectric layer may be silicon oxide, and correspondingly, a thickness of the initial first dielectric layer is increased to improve the insulation properties.

A second dielectric layer 113 is used as a gate dielectric layer. After the word lines 109 and the bit lines 103 are activated, a trench can be generated on surface of the active layer 114 close to the second dielectric layer 113. To be specific, a trench can be formed only on the left side of the word line 109, and the right side of the word line 109 is isolated by the first dielectric layer 112.

It should be noted that, in other embodiments, alternatively, the first dielectric layer and the second dielectric layer may both have a single-layer structure, and the material of the first dielectric layer may be the same as that of the second dielectric layer.

In this embodiment, a bit line contact layer 115 located between the bit line 103 and the active layer 114 is further included.

In this embodiment, an insulation cover layer 110 located on the word lines 109 is further included.

In this embodiment, a capacitive contact layer 116 located on the active layer 114 is further included, and the capacitive contact layer 116 is further located between parts of the insulation cover layer 109.

In this embodiment, the capacitive contact layer 116, the bit line contact layer 115, and the active layer 114 are made of doped polycrystalline silicon. Doped ions of the capacitive contact layer 116 and doped ions of the bit line contact layer 115 are of the same type, both being N-type ions or P-type ions. Doped ions of the active layer 114 are of a type opposite to the type of the doped ions of the capacitive contact layer 116 and the bit line contact layer 115.

In summary, in this embodiment, a thickness of an equivalent-gate dielectric layer of the first dielectric layer 112 is greater than a thickness of an equivalent-gate dielectric layer of the second dielectric layer 113. A second dielectric layer 113 is used as a gate dielectric layer, and a trench can be formed on surface of the active layer 114 close to the second dielectric layer 113. The first dielectric layer 112 has a large thickness and a large dielectric constant, and when the word line 109 is activated, the first dielectric layer 112 can avoid impact on the trench close to the second side wall of the word line 109.

The embodiments or implementations of this specification are described in a progressive manner, and each embodiment focuses on differences from other embodiments. The same or similar parts between the embodiments may refer to each other.

In the description of this specification, the description with reference to the terms "embodiments", "exemplary embodiments", "some implementations", "exemplary implementations", "examples", and the like means that the specific features, structures, materials, or characteristics described in conjunction with the implementations or examples are included in at least one implementation or example of the present disclosure.

In this specification, the schematic expression of the above terms does not necessarily refer to the same implementation or example. Moreover, the described specific features, structures, materials, or characteristics may be combined in an appropriate manner in any one or more implementations or examples.

In the description of the present disclosure, it should be noted that orientations or position relationships indicated by terms "center", "top", "bottom", "left", "right", "vertical", "horizontal", and the like are orientation or position relationships shown in the accompanying drawings, and these terms are used only to facilitate description of the present disclosure and simplify the description, but not to indicate or imply that the mentioned apparatuses or elements must have a specific orientation or must be constructed and operated in a specific orientation. Therefore, these terms should not be understood as a limitation on the present disclosure.

It can be understood that the terms "first", "second", and the like used in the present disclosure can be used in the present disclosure to describe various structures, but these structures are not limited by these terms. These terms are used only to distinguish a first structure from another structure.

In one or more accompanying drawings, the same elements are represented by similar reference numerals. For clarity, a plurality of parts of the accompanying drawings are not drawn to scale. In addition, some well-known parts may not be shown. For brevity, a structure obtained after several steps can be illustrated in one figure. Many particular details of the present disclosure, such as the structure, material, size, processing process, and technology of the device, are described below for a clearer understanding of the present disclosure. However, as can be understood by persons skilled in the art, the present disclosure may be implemented without following these particular details.

Finally, it should be noted that the foregoing embodiments are used only to explain the technical solutions of the present disclosure, but are not intended to limit the present disclosure. Although the present disclosure has been described in detail with reference to the foregoing embodiments, persons of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

According to the manufacturing method for memory and the memory provided in the embodiments of the present disclosure, a thickness of an equivalent-gate dielectric layer of first dielectric layer is greater than a thickness of an equivalent-gate dielectric layer of second dielectric layer, that is, a second dielectric layer is used as a gate dielectric layer, and a trench can be formed in an active layer in close contact with the second dielectric layer; and the first dielectric layer is used as an isolation structure, so that interference between adjacent trenches can be avoided. In addition, word lines are formed on bit lines, and an active layer is formed between the word lines, so that the bit lines, the word lines, and the active layer are more closely arranged, and subsequently formed capacitors can also have higher arrangement density, thereby reducing a size of the memory.

What is claimed is:

1. A manufacturing method for memory, comprising:
providing a substrate, and forming a first isolation layer and discrete bit lines on the substrate, wherein the bit lines extend along a first direction, and the first isolation layer is located on surfaces of the bit lines away from the substrate and further located between adjacent bit lines;
removing part of the first isolation layer by a thickness to form discrete first trenches, wherein the first trenches extend along a second direction, and the second direction is different from the first direction;
forming word lines filling the first trenches, wherein the first isolation layer with a certain thickness is provided between the word lines and the bit lines, and the word lines each has a first side wall and a second side wall opposite to each other;
forming discrete through holes each being between adjacent word lines, wherein the through holes expose the first side wall and the second side wall of each of the word lines, and the surfaces of the bit lines; and the first side wall and the second side wall are arranged oppositely;
forming a first dielectric layer on a surface of the exposed first side wall, and forming a second dielectric layer on a surface of the exposed second side wall, wherein a thickness of an equivalent-gate dielectric layer of the first dielectric layer is greater than a thickness of an equivalent-gate dielectric layer of the second dielectric layer; and
forming an active layer filling the through holes after the first dielectric layer and the second dielectric layer are formed.

2. The manufacturing method for memory according to claim 1, wherein forming the first dielectric layer and the second dielectric layer comprises:
forming an initial first dielectric layer on the surface of the exposed first side wall and the surface of the exposed second side wall of each of the word lines;
removing a part of the initial first dielectric layer on the second side wall; and
forming an initial second dielectric layer on a surface of a remaining part of the initial first dielectric layer and the surface of the exposed second side wall;
wherein the remaining part of the initial first dielectric layer and the initial second dielectric layer covering the initial first dielectric layer are used as the first dielectric layer; and the initial second dielectric layer covering the surface of the second side wall is used as the second dielectric layer.

3. The manufacturing method for memory according to claim 1, wherein before the forming the active layer, the manufacturing method further comprises: forming a bit line contact layer, wherein the bit line contact layer is located between the bit lines and the active layer.

4. The manufacturing method for memory according to claim 1, wherein after the forming the word lines, the manufacturing method further comprises: forming an insulation cover layer on the word lines; and
after the forming the active layer, the manufacturing method further comprises: forming a capacitive contact layer on the active layer, wherein the capacitive contact layer is further located between parts of the insulation cover layer.

5. The manufacturing method for memory according to claim 1, wherein forming the bit lines and the first isolation layer comprises:
forming second trenches in the substrate, and sequentially forming the bit lines and a second isolation layer in the second trenches, wherein the second isolation layer fills the second trenches;
removing the substrate between adjacent bit lines and between parts of second isolation layer to form third trenches; and
forming a third isolation layer filling the third trenches, wherein the third isolation layer and the second isolation layer constitute the first isolation layer.

6. The manufacturing method for memory according to claim 1, wherein forming the bit lines and the first isolation layer comprises:
forming a second isolation layer on the substrate, forming second trenches in the second isolation layer, forming the bit lines filling the second trenches, and forming a third isolation layer on the bit lines and the second isolation layer, wherein the second isolation layer and the third isolation layer constitute the first isolation layer.

7. A manufacturing method for memory, comprising:
providing a substrate, and forming a first isolation layer and discrete bit lines on the substrate, wherein the bit lines extend along a first direction, and the first isolation layer is located on surfaces of the bit lines away from the substrate and further located between adjacent bit lines;

removing part of the first isolation layer by a thickness to form through holes arranged in an array, wherein the through holes expose part of the surface of the bit lines, and forming an active layer filling the through holes;

removing part of the first isolation layer to form discrete first trenches, wherein the first trenches extend along a second direction, and the second direction is different from the first direction; and the first trenches expose a first side face and a second side face of the active layer, the first side face and the second side face are arranged oppositely;

forming a first dielectric layer on the first side face, and forming a second dielectric layer on the second side face, wherein a thickness of an equivalent-gate dielectric layer of the first dielectric layer is greater than a thickness of an equivalent-gate dielectric layer of the second dielectric layer; and forming word lines filling the first trenches after the first dielectric layer and the second dielectric layer are formed.

8. The manufacturing method for memory according to claim 7, wherein forming the first dielectric layer and the second dielectric layer comprises:

forming an initial first dielectric layer on the first side face and second side face of the active layer, and removing a part of the initial first dielectric layer on the second side face; and forming an initial second dielectric layer on a surface of a remaining part of the initial first dielectric layer and the second side face;

wherein the remaining part of the initial first dielectric layer and the initial second dielectric layer covering the initial first dielectric layer are used as the first dielectric layer; and the initial second dielectric layer covering the second side face is used as the second dielectric layer.

9. A memory, comprising:

a substrate;

discrete bit lines located on the substrate, wherein the bit lines extend along a first direction;

discrete word lines located on the bit lines, wherein the word lines extend along a second direction, and the second direction is different from the first direction; and the word lines each has a first side wall and a second side wall opposite to each other;

an active layer, wherein the active layer is discrete and is provided between the word lines, and the active layer is located on the bit lines;

a first isolation layer, wherein the first isolation layer is provided between adjacent bit lines, between the bit lines and the word lines, and between discrete parts of the active layer;

a first dielectric layer, wherein the first dielectric layer is provided between the active layer and the first side wall; and a second dielectric layer, wherein the second dielectric layer is provided between the active layer and the second side wall;

wherein a thickness of an equivalent-gate dielectric layer of the first dielectric layer is greater than a thickness of an equivalent-gate dielectric layer of the second dielectric layer; the first dielectric layer is of a two-layer structure, comprising an initial first dielectric layer and an initial second dielectric layer, the initial first dielectric layer covers the first side wall, and the initial second dielectric layer covers the initial first dielectric layer; a material of the initial first dielectric layer comprises a high-dielectric-constant material, and a material of the initial second dielectric layer comprises silicon oxide.

10. The memory according to claim 9, wherein the memory further comprises: a bit line contact layer located between the bit lines and the active layer; an insulation cover layer located on the word lines; and a capacitive contact layer located on the active layer, wherein the capacitive contact layer is further located between parts of the insulation cover layer.

* * * * *